(12) United States Patent
Kalandar et al.

(10) Patent No.: US 9,721,928 B1
(45) Date of Patent: Aug. 1, 2017

(54) INTEGRATED CIRCUIT PACKAGE HAVING TWO SUBSTRATES

(71) Applicant: FREESCALE SEMICONDUCTOR, INC., Austin, TX (US)

(72) Inventors: Navas Khan Oratti Kalandar, Austin, TX (US); Lan Chu Tan, Singapore (SG); Chetan Verma, Noida (IN)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 15/141,628

(22) Filed: Apr. 28, 2016

(51) Int. Cl.
| | |
|---|---|
| *H01L 23/48* | (2006.01) |
| *H01L 25/065* | (2006.01) |
| *H01L 25/00* | (2006.01) |
| *H01L 23/00* | (2006.01) |
| *H01L 23/31* | (2006.01) |
| *H01L 21/56* | (2006.01) |

(52) U.S. Cl.
CPC ........ *H01L 25/0657* (2013.01); *H01L 21/563* (2013.01); *H01L 23/3178* (2013.01); *H01L 24/09* (2013.01); *H01L 24/17* (2013.01); *H01L 24/49* (2013.01); *H01L 24/81* (2013.01); *H01L 24/85* (2013.01); *H01L 25/50* (2013.01); *H01L 2224/0912* (2013.01); *H01L 2224/0951* (2013.01); *H01L 2224/1712* (2013.01); *H01L 2224/17104* (2013.01); *H01L 2224/4912* (2013.01); *H01L 2224/8134* (2013.01); *H01L 2224/8534* (2013.01); *H01L 2225/0651* (2013.01); *H01L 2225/06513* (2013.01); *H01L 2225/06555* (2013.01)

(58) Field of Classification Search
CPC ............. H01L 25/0657; H01L 25/0756; H01L 25/117; H01L 21/563; H01L 24/09; H01L 24/14; H01L 24/16; H01L 24/17; H01L 2224/48227; H01L 2924/181; H01L 2224/97; H01L 2225/1058; H01L 23/3128; H01L 2224/81; H01L 24/45; H01L 23/49816; H01L 2225/0651; H01L 21/56
See application file for complete search history.

(56) References Cited

U.S. PATENT DOCUMENTS

| | | |
|---|---|---|
| 5,838,072 A | 11/1998 | Li et al. |
| 6,931,934 B2 | 8/2005 | Gall et al. |
| 7,554,185 B2 | 6/2009 | Foong et al. |
| 8,409,917 B2 | 4/2013 | Yoon et al. |
| 2004/0178498 A1 | 9/2004 | Alagaratnam et al. |

(Continued)

*Primary Examiner* — Khiem D Nguyen
(74) *Attorney, Agent, or Firm* — Charles E. Bergere

(57) ABSTRACT

A packaged IC device in which a die is sandwiched between first and second substrates such that (i) peripheral electrical contact pads of the die are wire bonded to the first substrate, e.g., for routing functional input/output signals, and (ii) core-area electrical contact pads of the die are connected to the second substrate in a flip-chip arrangement, e.g., for routing one or more power supply voltages to the core area of the die. The second substrate has a shape and position that (i) expose the peripheral electrical contact pads of the die for unencumbered machine-implemented wire bonding during the assembly process, and (ii) enable direct electrical connections between the first and second substrates outside the footprint of the die, e.g., by way of the corresponding solder bumps attached between the two substrates.

15 Claims, 3 Drawing Sheets

(56) References Cited

U.S. PATENT DOCUMENTS

| | | | |
|---|---|---|---|
| 2012/0241925 A1* | 9/2012 | Yoon | H01L 21/563 |
| | | | 257/666 |
| 2012/0248439 A1* | 10/2012 | Lee | H01L 23/49838 |
| | | | 257/48 |
| 2015/0187728 A1 | 7/2015 | Muniandy et al. | |

* cited by examiner

INTEGRATED CIRCUIT PACKAGE HAVING TWO SUBSTRATES

BACKGROUND

The present disclosure relates to integrated circuit (IC) packaging, and, more particularly, to an IC package having where a die is located between two substrates.

Flip-chip and wire bonding technologies are widely used for interconnecting ICs. While each of these technologies offers significant respective benefits and/or advantages in certain types of applications, IC packaging continues to evolve by providing more narrowly tailored solutions to specific segments of the packaged IC market. For example, several product specific factors typically need to be considered before the most appropriate means of IC interconnection can be selected.

BRIEF DESCRIPTION OF THE DRAWINGS

Embodiments of the present invention(s) are illustrated herein by way of example and are not limited by the accompanying figures, in which like references indicate similar elements. Elements in the figures are illustrated for simplicity and clarity and have not necessarily been drawn to scale. Various aspects, features, and benefits of the disclosed embodiments will become more fully apparent, by way of example, from the following detailed description that refers to the accompanying figures, in which.

DETAILED DESCRIPTION

Figure 1A:
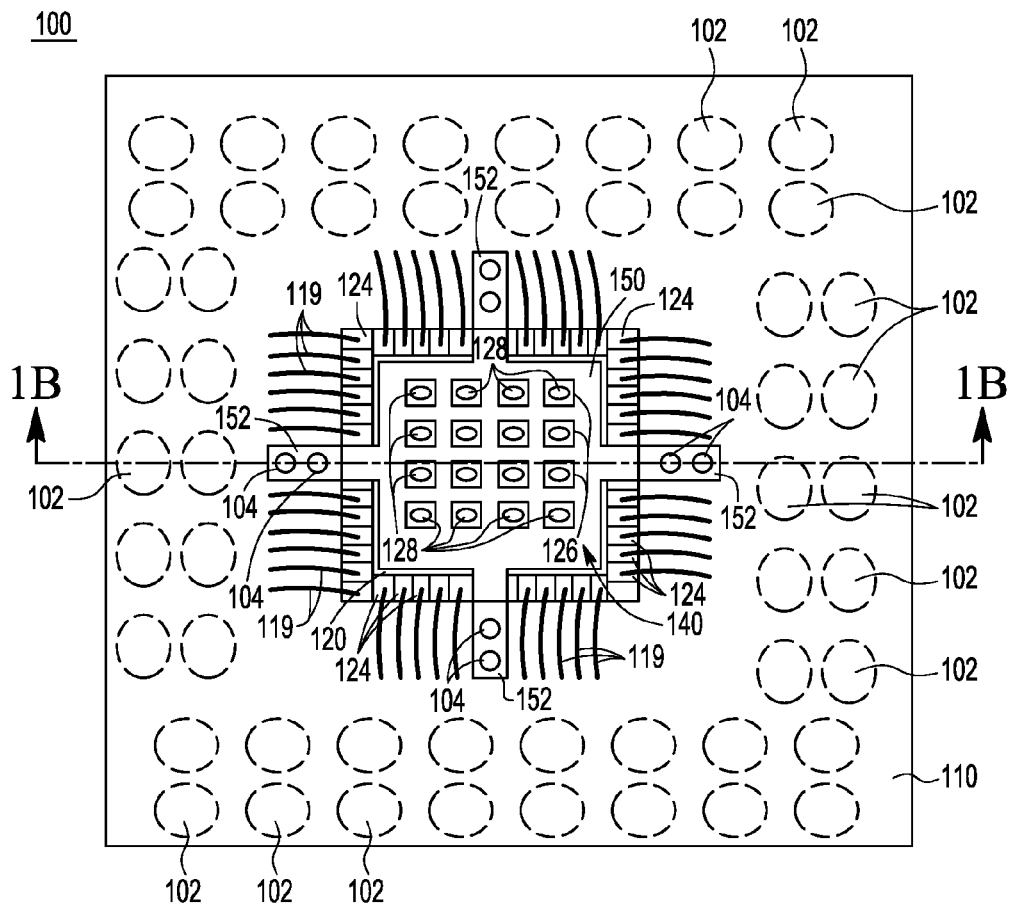
FIG. 1A is a top X-ray view of a packaged IC device according to an embodiment of the invention.

Detailed illustrative embodiments of the present invention are disclosed herein. However, specific structural and functional details to which the disclosure refers are merely representative for purposes of describing example embodiments of the present invention. Embodiments of the present invention may be embodied in many alternative forms and should not be construed as limited to only the embodiments set forth herein.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative embodiments, certain functions or acts may occur out of the order indicated in the figures.

In a typical IC fabrication process, chips (dies) are produced in relatively large batches using wafers of electronic-grade silicon or other suitable semiconductor material(s). Electrical circuits are gradually created on a wafer using a multi-step sequence of photolithographic and chemical processing steps. The wafer is then cut ("diced") into many pieces (chips, dies), each containing a respective copy of the electrical circuit that is being fabricated. Each individual die is then appropriately packaged to produce the corresponding packaged IC device.

Dies intended for wire bond packages are fabricated with small metal pads, typically located near the die edges. The dies are attached face up on a carrier, such as an interconnecting substrate, an interposer, a laminate plate, a wire board, or the like and then bond wires are attached to the die pads on the face (or active side) of the die and to corresponding contact pads on the carrier. The bond wires and the patterned conducting layers located in the body and/or on the surface of the carrier provide electrical connections between the die and terminals (or pins) on the outside of the IC package. The pins/terminals can then be used to attach and electrically connect the packaged IC device to external electrical circuitry, such as a printed-circuit-board (PCB) assembly.

Processing a die intended for a flip-chip assembly is similar but has several additional and/or modified processing steps. For example, the small metal pads on the face of the die are arranged in a two-dimensional area array instead of being in one or more linear edge arrays. This design feature can be realized, e.g., by adding dielectric and metal layers configured to appropriately route electrical connections from the functional semiconductor layer(s) of the die to the metal pads. A small bump (ball) of solder is deposited on each metal pad. The wafer is then diced as usual. The resulting individual dies are fluxed and placed on the respective carriers (interconnecting substrates) face down (e.g., in a flipped orientation compared to that in a wire bond package). The solder is then reflowed to form permanent electrical connections between the die and the substrate/carrier.

Flip-chip devices can have many more bumps than equivalent wire bond devices can have wire bonds. Because the bumping cost per die is substantially fixed (e.g., can be independent of how many bumps there are per die), certain engineering benefits of having additional bumps can be realized. For example, as chip voltages drop and electrical current requirements become more stringent, it is sometimes more advantageous to distribute power and ground directly to the core of the die, e.g., using the flip-chip area array bumps. These low-inductance, low-resistance power and ground paths can also reduce simultaneous switching noise and ground bounce. On especially sensitive signal paths, additional power and ground bumps can be used to surround a sensitive input/output (I/O) signal bump, thereby electrically shielding the latter from the noise induced by adjacent circuitry.

Oftentimes, both flip-chip and wire bond technologies can offer product specific benefits and/or advantages. An example is cost. The typical total cost for a wire-bond package having between about 100 and 500 I/O connections in the can be much lower than the typical total cost of a functionally equivalent flip-chip package. On the other hand, for high-volume, where the die size has been deliberately minimized to take advantage of the flip-chip's efficient use of the semiconductor real estate, the concomitant increase in the number of dies per wafer is sometimes capable of lowering the total cost per flip-chip package below that of a functionally equivalent wire-bond package.

According to the present invention, at least some of the above-indicated problems in the prior art are addressed by a packaged IC device in which a die is sandwiched between first and second package substrates such that (i) peripheral electrical contact pads of the die are wire-bonded to the first package substrate, for example, for routing functional I/O signals and (ii) core-area electrical contact pads of the die are connected to the second package substrate in a flip-chip arrangement, for example, for routing one or more power-supply voltages to the core area. The second package substrate has a shape and position that (i) expose the peripheral electrical contact pads of the die for unencumbered wire bonding thereto during the assembly process, e.g., by leaving these contact pads accessible from the space above the second package substrate, and (ii) enable direct electrical connections between the first and second package substrates outside the footprint of the die, e.g., by way of the corresponding solder bumps attached between the two package substrates.

In some embodiments, the molding compound used to fill gaps between the die and the first and second package substrates is applied such that it does not cover an outer surface of the second package substrate, thereby enhancing the power-handling capabilities of the packaged IC device through more efficient heat transfer and/or dissipation by that outer surface.

Accordingly, in one embodiment, the present invention is a packaged IC device comprising first and second package substrates, and a die attached at a first side thereof to the first package substrate and attached at an opposite, second side thereof to the second package substrate. The die comprises a first plurality of electrical contact pads located at respective edges of the die on the second side thereof, and a second plurality of electrical contact pads located at a core area of the die on the second side thereof. The packaged IC device further comprises a plurality of bond wires attached at one end thereof to a respective electrical contact pad of the first plurality of electrical contact pads and at a second end thereof to a respective electrical contact pad of the first package substrate. There also is a first plurality of solder bumps attached between respective electrical contact pads of the second plurality of electrical contact pads and respective electrical contact pads of the second package substrate.

Another embodiment of the present invention is a method of packaging an IC device, the method comprising the steps of: (A) attaching a die at a first side thereof to a first package substrate, wherein the die comprises: a first plurality of electrical contact pads, each located at a respective edge of the die on a second side thereof; and a second plurality of electrical contact pads located at a core area of the die on the second side thereof; (B) attaching each of a first plurality of solder bumps to a respective electrical contact pad of a second package substrate; (C) attaching the second package substrate to the die in a manner that causes each of the first plurality of solder bumps to be attached between a respective electrical contact pad of the second plurality of electrical contact pads and the respective electrical contact pad of the second package substrate; and (D) attaching a plurality of wires, with each of the wires being bonded at one end thereof to a respective electrical contact pad of the first plurality of electrical contact pads and at a second end thereof to a respective electrical contact pad of the first package substrate.

Figure 1B:
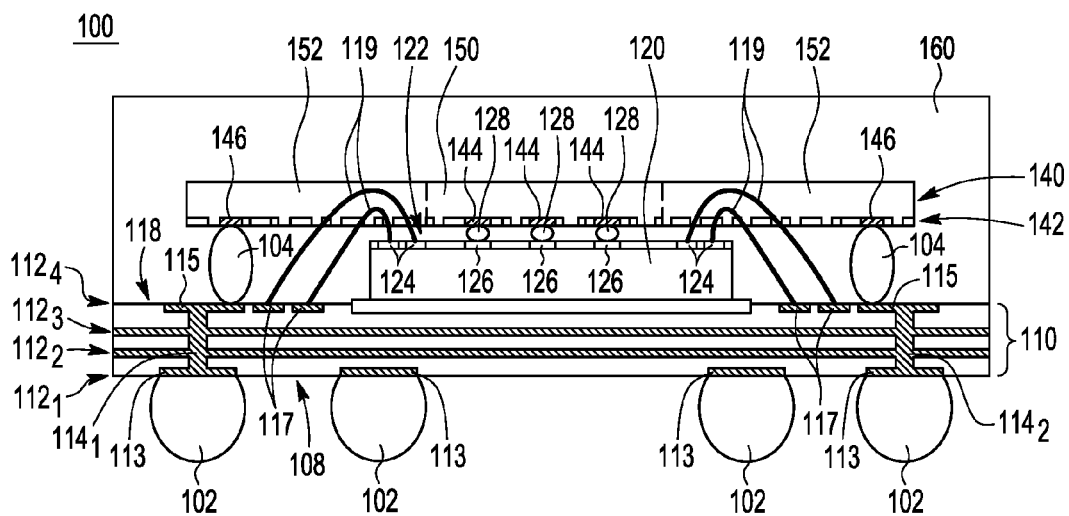
FIG. 1B is a cross-sectional side view of the packaged IC device of FIG. 1A.

Referring now to FIGS. 1A-1B, FIG. 1A shows a top (plan) X-ray view of the packaged IC device 100 and FIG. 1B shows a cross-sectional side X-ray view of the packaged IC device 100 approximately corresponding to the cross-section plane B-B indicated in FIG. 1A. The IC device 100 comprises a first package substrate 110, a die 120, and a second package substrate 140, where the die 120 is sandwiched between the first and second substrates 110 and 140. A molding compound 160 fills gaps between the die 120 and the first and second substrates 110 and 140, encapsulating the die 120 and the second substrate 140 as shown in FIG. 1B.

In one embodiment, the first substrate 110 is multi-layer substrate and includes (i) several metal layers 112 separated by non-conductive layers, where each of the metal layers 112 has respective planar metal tracks for routing electrical signals and power supply voltages, and (ii) metal vias 114 that electrically connect the different respective patterned metal tracks of the layers 112 to one another. For example, FIG. 1B shows four metal layers, labeled as $112_1$-$112_4$. A person of ordinary skill in the art will understand that, in alternative embodiments, the first substrate 110 can have more or fewer than four metal layers 112.

Some of the metal vias 114 are configured to electrically connect respective electrical contact pads 115 located on a first or inner side 118 of the first substrate 110 to respective electrical contact pads 113 located on a second or outer side 108 of the first substrate 110. Note, the designations "outer" and "inner" reflect the relative positions of these surfaces in the packaged IC device 100, as viewed in FIG. 1B. For example, FIG. 1B shows two such metal vias labeled 1141 and 1142, respectively. A person of ordinary skill in the art will appreciate that, in an alternative embodiment, the first substrate 110 may have many more of the vias 114. In some embodiments, some of the vias are configured to each electrically connect two or more of the metal layers 112 without necessarily extending through the full thickness of the substrate 110 between the first and second surfaces 118, 108 thereof.

In one embodiment, the metal layer $112_1$ includes a plurality of the electrical contact pads 113, each having connected thereto a respective solder bump 102. A person of ordinary skill in the art will understand that the solder bumps 102 form a ball grid array (BGA) that can be used to mechanically and electrically connect the packaged IC device 100 to external electrical circuitry, such as a PCB assembly. The metal layer $112_4$ similarly includes a plurality of the electrical contact pads 115, each having connected thereto a respective solder bump 104. The solder bumps 104 serve to provide respective electrical connections between the first substrate 110 and the second substrate 140.

The metal layer $112_4$ further includes a plurality of electrical contact pads 117, each having connected thereto a bond wire 119 for electrically connecting the die 120 to the first substrate 110.

The die 120 is attached to the first substrate 110 in a "face-up" or active side up orientation with respect to the substrate 110. The die 120 also is attached to the second substrate 140 in a flip-chip or "face-down" orientation with respect to the second substrate 140. As used herein, the term "face-up" refers to a die orientation in which the semiconductor substrate and the front-end-of-line (FEOL) portion of the die are at a smaller offset distance with respect to the corresponding package substrate than the back-end-of-line (BEOL) portion of the die. Conversely, the terms "flip-chip" or "face-down" orientation refer to a die orientation in which the semiconductor substrate and the FEOL portion of the die are at a larger offset distance with respect to the corresponding package substrate than the BEOL portion of the die. As known in the art, the FEOL portion of a die typically includes the semiconductor-device layers of the die having the physical structures (such as semiconductor junctions, transistor gates, sources, and drains, doped regions, microplates, traces, etc.) of the various circuit elements (such as transistors, diodes, resistors, capacitors, etc.) of the die. In contrast, the BEOL portion of a die typically includes the patterned metal interconnect layers that are isolated from one another by the interleaved dielectric layers.

A face (or active side) 122 of the die 120 has a plurality of electrical contact pads 124 and 126 that are part of the BEOL portion of the die 120. The electrical contact pads 124 are arranged in one or more substantially linear arrays along the edges of the die 120 and the bond wires 119 are attached thereto. The electrical contact pads 126 are arranged in a two-dimensional array located in a middle portion of the face 122. Each of the electrical contact pads 126 has a respective solder bump 128 connected thereto. The solder bumps 128 serve to provide a respective electrical connection between the die 120 and the second substrate 140.

In one embodiment, the second substrate 140 has a single metal layer 142 located on a first or inner surface thereof. The metal layer 142 includes (i) planar metal tracks and (ii) a plurality of electrical contact pads 144 and 146. The electrical contact pads 144 are connected to corresponding solder bump 128, while the electrical contact pads 146 are similarly connected to corresponding solder bumps 104. The solder bumps 104 electrically connect the first and second substrates 110 and 140.

The second substrate 140 has a shape that enables: (i) flip-chip attachment of the die 120 to the substrate 140 using the electrical contact pads 126 and 144 and the solder bumps 128; (ii) attachment of the second substrate 140 to the first substrate 110 using the electrical contact pads 115 and 146 and the solder bumps 104; and (ii) unencumbered machine-implemented attachment of the bond wires 119 between the die outer electrical contact pads 124 and the first substrate electrical contact pads 117. As best seen in FIG. 1A, all of these functional attributes are achieved by the indicated example shape of the second substrate 140, which can be characterized as having a rectangular main body 150 and four rectangular extensions 152, which is the embodiment shown are centrally located at the respective lateral sides of the main body 150. The main body 150 has the electrical contact pads 144 and has a footprint that is smaller than the footprint of the die 120 by a margin that leaves the die electrical contact pads 124 outside of the footprint of the main body 150 and exposed to all for the bond wires 119 to be readily attached using a commercially available wire bonding machine. The extensions 152 include the electrical contact pads 146 and extend outside the footprint of the die 120 such that the solder bumps 104 are positioned to bridge the gap between an electrical contact pad 115 on the first side of the first substrate 110 and a corresponding electrical contact pad 146 on the first side of the second substrate 140.

In one embodiment, the second substrate 140 operates to deliver one or more power supply voltages directly to the core of the die 120. Such use of the second substrate 140 largely eliminates the need for relatively long power buses within the die 120 that, in a conventional die, are used to distribute power from peripheral electrical contact pads to the core circuits of the die. This particular characteristic of the IC device 100 is beneficial because relatively long power buses tend to cause relatively high resistive losses and concomitant voltage drops, e.g., due to the inherent relatively high resistivity of the (small-feature-size) on-chip conductors.

Each of the high (and/or low) and ground potentials of a power supply can be routed from an external power supply to the core of the die 120, for example, as follows: (i) from a solder bump 102 to a corresponding solder bump 104 by way of the corresponding electrical contact pad 113, via 114, and electrical contact pad 115 of the first substrate 110; (ii) from the solder bump 104 to a corresponding solder bump 128 by way of the corresponding electrical contact pad 146 of the second substrate 140, the metal layer 142, and the corresponding electrical contact pad 144; and (iii) from the solder bump 128 to the corresponding die electrical contact pad 126 and then to a respective core circuit located in proximity to that electrical contact pad 126 in the die 120. However, if appropriate or necessary, some of these connections can be used to deliver functional I/O signals to and/or from the die 120 in a conventional manner.

The bond wires 119 are used to carry functional I/O signals to and/or from the die 120. However, if appropriate or necessary, some of the wires 119 can be used to deliver power-supply voltages to the electrical contact pads 124 of the die 120 in a conventional manner.

FIGS. 2A-2E are cross-sectional side views that illustrate a method of assembling the packaged IC device 100 (FIGS. 1A-1B) according to an embodiment of the invention.

Figure 2A:
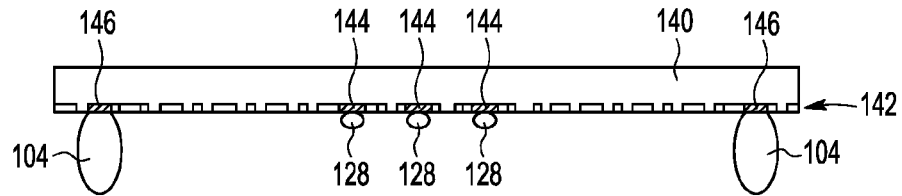
FIGS. 2A-2E are cross-sectional side views illustrating a method that can be used to assemble the IC device of FIGS. 1A and 1B according to an embodiment of the invention.

FIG. 2A illustrates the preparation of the second substrate 140. The metal layer 142 of the second substrate 140 is patterned and etched to create the electrical contact pads 144 and 146 and the corresponding planar metal tracks (not explicitly shown in FIG. 2A). The solder bumps 128 are attached to the electrical contact pads 144, and the larger solder bumps (or pillars) 104 are attached to the electrical contact pads 146.

Figure 2B:
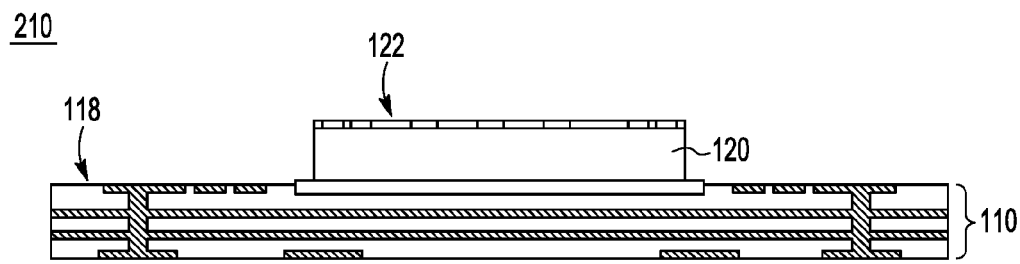

FIG. 2B illustrates the step of attaching the die 120 to the first substrate 110. As already indicated above, the die 120 is attached to the first substrate 110 in a face-up orientation, in which the face or active side 122 of the die 120 points away from the first side or surface 118 of the first substrate 110. The resulting die/substrate assembly of FIG. 2B is labeled 210.

Figure 2C:
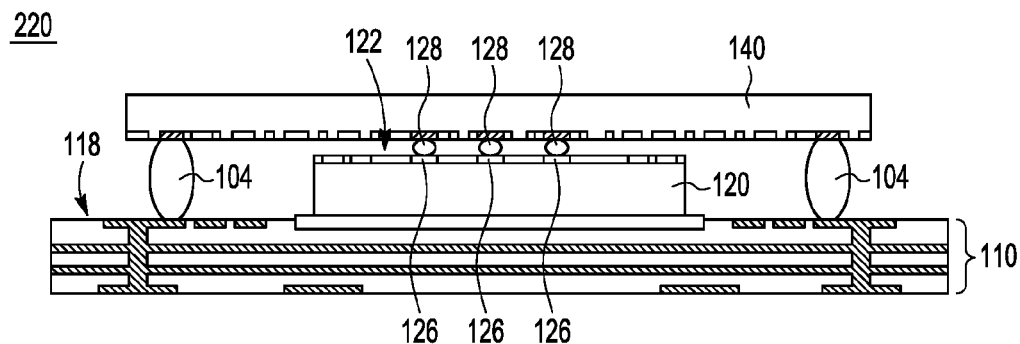

FIG. 2C illustrates the step of attaching the prepared second substrate 140 of FIG. 2A to the die/substrate assembly 210 of FIG. 2B. This step may include the sub-steps of (i) positioning the prepared second substrate 140 on the die/substrate assembly 210 such that (a) the solder bumps 128 align with the respective electrical contact pads 126 on the face 122 and (b) the larger solder bumps or pillars 104 align with the respective electrical contact pads 115 on the first side 118 of the first substrate 110; and (ii) reflowing the solder balls/pillars to create permanent mechanical and electrical connections between the die/substrate assembly 210 and the second substrate 140. The substrate/die/substrate sandwich 220 is then washed and annealed as known in the art.

Figure 2D:
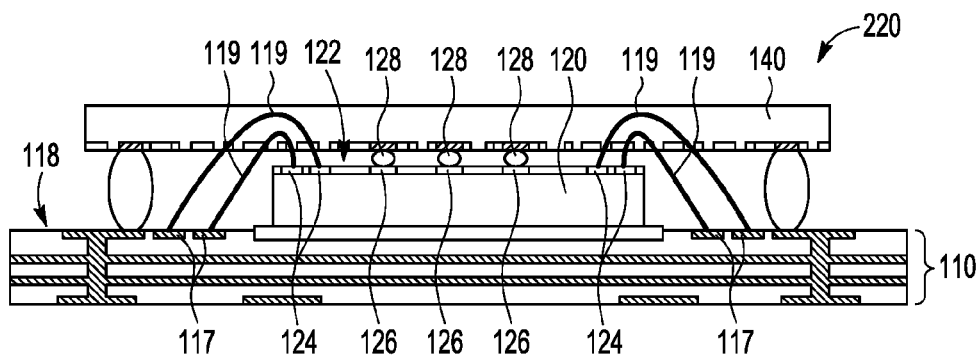

FIG. 2D illustrates the step of attaching the bond wires 119 to the substrate/die/substrate sandwich 220. As already indicated above in reference to FIG. 1A, the shape of the second substrate 140 enables unencumbered access to the peripheral electrical contact pads 124 on the face 122 of the die 120 and also to the electrical contact pads 117 on the first side 118 of the first substrate 110 to allow a commercial wire bonding machine to attach the bond wires 119 to the die 120 and the first substrate 110.

Figure 2E:
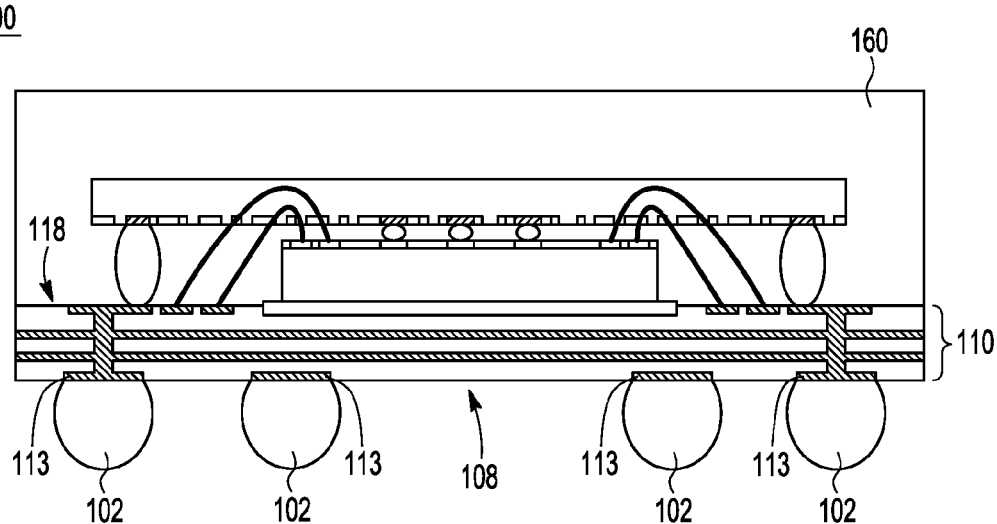

FIG. 2E illustrates the processing that transforms the wire bonded substrate/die/substrate sandwich 220 of FIG. 2D into the packaged IC device 100 (also see FIGS. 1A-1B). In one embodiment, this processing may include the steps of (i) encapsulating the wire-bonded substrate/die/substrate sandwich 220 of FIG. 2D with a suitable plastic material or mold compound 160 to form the package body; (ii) attaching the solder bumps 102 to the respective electrical contact pads 113 on the second, outer side 108 of the first substrate 110; and (iii) singulating the packaged IC device 100 from adjacent, simultaneously assembled devices when batch production performed.

Figure 3:
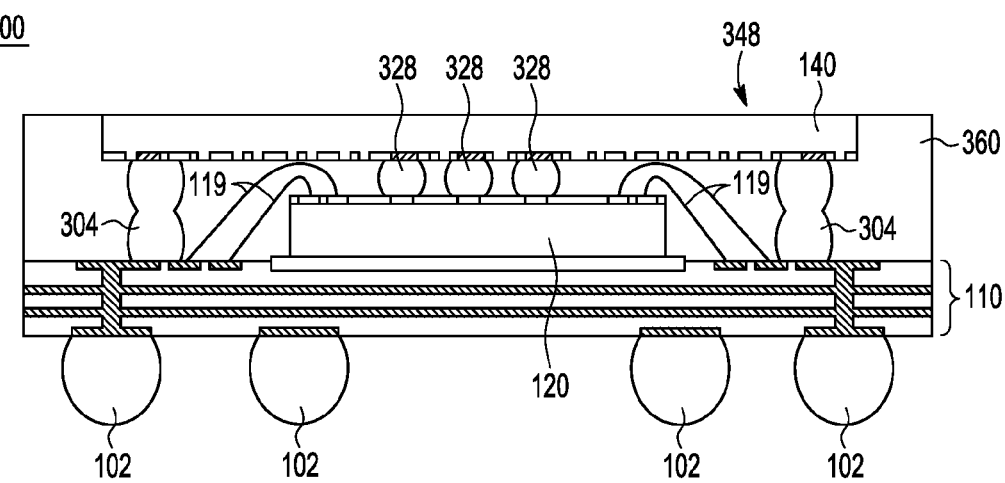
FIG. 3 is a cross-sectional side view of a packaged IC device according to an alternative embodiment of the invention.

FIG. 3 is a cross-sectional side view of a packaged IC device 300 according to an alternative embodiment of the invention. The IC device 300 is generally analogous to the IC device 100 (FIGS. 1-2) and uses most of the same parts, as indicated by the corresponding labeling in FIG. 3. However, the IC device 300 is designed to have higher power-handling capabilities than the IC device 100.

In particular, the second substrate 140 in the IC device 300 is positioned at a larger offset distance from the die 120 and the first substrate 110 than in the IC device 100. The larger offset distance enables the molding compound 360 to be formed in a manner that leaves the outer surface 348 of the second substrate 140 exposed, as opposed to being covered by and buried under a layer of the molding compound 360, as in the IC device 100 (see, e.g., FIG. 1B). Due to the surface 348 of the second substrate 140 being exposed, the second substrate 140 is able to transfer out and/or dissipate more heat than in the IC device 100. The more-efficient heat transfer/dissipation in turn enables the IC device 300 to tolerate higher power than the IC device 100.

In an example embodiment, the larger offset distance for the second substrate 140 in the IC device 300 can be achieved by the use of (i) double solder bumps 304 instead of the solder bumps 104 and (ii) larger solder bumps 328 instead of the smaller solder bumps 128 (e.g., compare FIGS. 3 and 1B). A person of ordinary skill in the art will understand that, in alternative embodiments, other physical means for placing the second substrate 140 at a larger offset distance with respect to the die 120 and the first substrate 110 can similarly be used.

In some embodiments, the outer surface 348 of the second substrate 140 can be exposed (not covered by and buried under a layer of the molding compound) without necessarily increasing the gap between the first and second substrates 110 and 140.

It will be further understood that various changes in the details, materials, and arrangements of the parts which have been described and illustrated in order to explain the nature of this invention may be made by those skilled in the art without departing from the scope of the invention as expressed in the following claims.

For example, although some embodiments of the second substrate 140 are described above as being designed and configured to route to the core of the die 120 exclusively the power-supply voltages, embodiments of the invention are not so limited. In some alternative embodiments, the second substrate 140 can be designed and configured to route to/from the core of the die 120 other electrical signals in addition to or instead of the power-supply voltages. The shape the package substrate 140 can differ from the example shape shown in FIG. 1A.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
a first substrate having a first side and a second side;
a second substrate having a first side and a second side;
a die having a first side attached to the first side of the first substrate, and a second, opposite side coupled to the first side of the second substrate, wherein the die comprises:
a first plurality of electrical contact pads located along respective edges of the die second side; and
a second plurality of electrical contact pads located at a core area of the die second side;
a plurality of bond wires attached at one end thereof to respective ones of the first plurality of electrical contact pads on the second side of the die and at a second end thereof to respective first electrical contact pads on the first side of the first substrate; and
a first plurality of solder bumps attached between respective ones of the second plurality of electrical contact pads on the second side of the die and respective first electrical contact pads on the first side of the second substrate, and
wherein the second substrate comprises:
a rectangular main body having the first electrical contact pads of the second substrate to which the first plurality of solder bumps are attached; and
one or more extensions, each extending outside of a footprint of the die from a respective edge of the rectangular main body.

2. The packaged IC device of claim 1, wherein the entire rectangular main body of the second substrate is located within the footprint of the die.

3. The packaged IC device of claim 1, further comprising a second plurality of solder bumps attached between a respective electrical contact pad of the first substrate and a respective electrical contact pad of the second substrate located on the one or more extensions.

4. The packaged IC device of claim 1, wherein:
the first plurality of electrical contact pads on the second side of the die are arranged in one or more linear arrays; and
the second plurality of electrical contact pads on the second side of the die are arranged in a two-dimensional area array located at the core area of the die.

5. The packaged IC device of claim 1, further comprising a molding compound that fills gaps between the die and the first and second substrates.

6. The packaged IC device of claim 5, wherein the molding compound fully encapsulates the second substrate.

7. The packaged IC device of claim 5, wherein the molding compound partially encapsulates the second substrate in a manner that exposes the second side of the second substrate.

8. The packaged IC device of claim 1, further comprising a second plurality of solder bumps attached between respective second electrical contact pads on the first side of the first substrate and respective second electrical contact pads on the first side of the second substrate.

9. The packaged IC device of claim 8, wherein:
each solder bump of the first plurality of solder bumps is located within a footprint of the die; and
each solder bump of the second plurality of solder bumps is located outside the footprint of the die.

10. The packaged IC device of claim 8, wherein the second substrate comprises a patterned metal layer for electrically connecting respective ones of the first plurality of solder bumps and respective ones of the second plurality of solder bumps.

11. The packaged IC device of claim 10, wherein the second substrate comprises a single metal layer, said single metal layer being the patterned metal layer.

12. The packaged IC device of claim 8, further comprising a third plurality of solder bumps attached to respective electrical contact pads on the second side of the first substrate.

13. The packaged IC device of claim 12, wherein the core area of the die is electrically connected to a subset of the third plurality of solder bumps by way of the first substrate, the second plurality of solder bumps, the second substrate, and the first plurality of solder bumps.

14. The packaged IC device of claim 8, wherein the core area of the die is electrically connected to the second side of the first substrate by way of the first substrate, the second plurality of solder bumps, the second substrate, and the first plurality of solder bumps.

15. The packaged IC device of claim 1, wherein:

the first side of the die corresponds to a front-end-of-line portion of the die; and the opposite second side of the die corresponds to a back-end-of-line portion of the die.

* * * * *